United States Patent
May

(10) Patent No.: US 9,264,080 B2
(45) Date of Patent: Feb. 16, 2016

(54) REDUCING SECOND ORDER DISTORTION IN AN AMPLIFIER

(71) Applicant: SILICON LABORATORIES INC., Austin, TX (US)

(72) Inventor: Mark May, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/170,107

(22) Filed: Jan. 31, 2014

(65) Prior Publication Data

US 2015/0222305 A1 Aug. 6, 2015

(51) Int. Cl.
*H04B 1/30* (2006.01)
*H04B 1/10* (2006.01)

(52) U.S. Cl.
CPC .................................. *H04B 1/1018* (2013.01)

(58) Field of Classification Search
CPC ........ H04B 1/30; H04B 1/109; H04B 10/505; H04B 10/58; H04B 1/525; H04B 10/2572; H04B 10/25759; H04B 10/564
USPC .................. 455/259, 63.1, 67.13, 114.3, 501; 330/9, 258, 259
See application file for complete search history.

(56) References Cited

U.S. PATENT DOCUMENTS

| | | | |
|---|---|---|---|
| 4,107,621 A | 8/1978 | Furutani et al. | |
| 4,833,418 A * | 5/1989 | Quintus et al. | 330/9 |
| 5,270,667 A | 12/1993 | Upton | |
| 5,347,388 A * | 9/1994 | Little et al. | 398/202 |
| 5,404,586 A * | 4/1995 | Ishiguro | 455/126 |
| 5,508,645 A * | 4/1996 | Castellucci et al. | 327/77 |
| 6,075,414 A | 6/2000 | Nagaoka et al. | |
| 6,100,759 A | 8/2000 | Sirna et al. | |
| 6,147,568 A | 11/2000 | Souetinov | |
| 6,181,206 B1 | 1/2001 | Palmisano et al. | |
| 6,307,200 B1 * | 10/2001 | Kuhnly et al. | 250/338.1 |
| 6,356,745 B1 | 3/2002 | Lee et al. | |
| 6,400,204 B1 | 6/2002 | Davis | |
| 6,553,216 B1 | 4/2003 | Pugel et al. | |
| 6,683,511 B2 | 1/2004 | Souetinov et al. | |
| 6,724,827 B1 | 4/2004 | Patsiokas et al. | |
| 6,735,418 B1 | 5/2004 | MacNally et al. | |
| 6,771,475 B2 | 8/2004 | Leete | |
| 7,127,217 B2 | 10/2006 | Tuttle | |
| 7,202,749 B2 | 4/2007 | Mohammadi | |
| 7,209,727 B2 | 4/2007 | Castaneda et al. | |
| 7,272,375 B2 | 9/2007 | Tuttle | |
| 7,355,476 B2 | 4/2008 | Kasha | |
| 7,386,284 B2 | 6/2008 | Thompson | |

(Continued)

OTHER PUBLICATIONS

U.S. Appl. No. 13/905,954, filed May 30, 2013, entitled "Radio Receiver Having Enhanced Automatic Gain Control Circuitry," by Mark May, et al.

(Continued)

*Primary Examiner* — Minh D Dao
(74) *Attorney, Agent, or Firm* — Trop, Pruner & Hu, P.C.

(57) ABSTRACT

In an embodiment, an apparatus includes a component of a receiver path to receive and process an incoming signal. At least one element of the component is controllable based on a DC output of the component, to compensate for a second order intermodulation product of the apparatus. As one example, the component is a differential amplifier including a first transistor and a second transistor.

16 Claims, 5 Drawing Sheets

(56) References Cited

U.S. PATENT DOCUMENTS

| | | | |
|---|---|---|---|
| 7,426,376 | B2 | 9/2008 | Srinivasan |
| 7,512,386 | B2 | 3/2009 | Kalajo et al. |
| 7,660,566 | B2 | 2/2010 | Kuo et al. |
| 8,195,096 | B2* | 6/2012 | Chiu et al. .................. 455/63.1 |
| 8,203,385 | B2 | 6/2012 | Kasha |
| 8,290,457 | B2 | 10/2012 | Li |
| 8,346,198 | B2 | 1/2013 | Kasha et al. |
| 2001/0041548 | A1* | 11/2001 | Bult et al. ................. 455/252.1 |
| 2003/0001690 | A1 | 1/2003 | Kuroda |
| 2003/0117206 | A1 | 6/2003 | Ohnakado |
| 2003/0216128 | A1* | 11/2003 | Zhou .......................... 455/127.1 |
| 2005/0134305 | A1* | 6/2005 | Stojanovic et al. ............. 326/31 |
| 2005/0134385 | A1 | 6/2005 | Costa et al. |
| 2005/0143044 | A1* | 6/2005 | Kim .............................. 455/334 |
| 2006/0273772 | A1* | 12/2006 | Groom .......................... 323/284 |
| 2007/0058308 | A1 | 3/2007 | Thijs et al. |
| 2007/0173220 | A1* | 7/2007 | Kim et al. ..................... 455/296 |
| 2009/0072901 | A1* | 3/2009 | Yamanouchi et al. ........ 330/149 |
| 2009/0280767 | A1* | 11/2009 | Tillman ......................... 455/318 |
| 2012/0157031 | A1 | 6/2012 | Strickland et al. |

OTHER PUBLICATIONS

US. Patent and Trademark Office Official Action dated Feb. 2, 2007 for Related U.S. Appl. No. 11/171,042, pp. 1-9.

Reply to Official Action dated Feb. 2, 2007, Filed on Apr. 20, 2007, pp. 1-9.

U.S. Patent and Trademark Office Official Action dated Jul. 3, 2007 for Related U.S. Appl. No. 11/171,042, pp. 1-9.

Reply to Official Action dated Jul. 3, 2007, Filed on Oct. 2, 2007, pp. 1-10.

U.S. Appl. No. 11/001,282, filed Dec. 1, 2004, entitled "Controlling the Gain of a Remote Active Antenna" by Charles D. Thompson.

U.S. Appl. No. 11/172,475, filed Jun. 30, 2005, entitled "Receiver Having Digital Automatic Gain Control" by Vishnu Srinivasan, G. Tyson Tuttle, Dan Kasha and Alessandro Piovaccari.

U.S. Appl. No. 10/881,926, filed Jun. 30, 2004, entitled "Integrated Low-IF Terrestrial Audio Broadcast Receiver and Associated Method" by G. Tyson Tuttle and Dan Kasha.

U.S. Appl. No. 11/081,959, filed Mar. 16, 2005, entitled "On-Chip Calibration Signal Generation for Tunable Filters for RF Communications and Associated Methods" by G. Tyson Tuttle and Dan Kasha.

U.S. Appl. No. 11/171,042, filed Jun. 30, 2005, entitled "An Input Stage for an Amplifier" by Dan B. Kasha, G. Tyson Tuttle and Gregory A. Hodgson.

U.S. Patent and Trademark Office, Office Action Mailed Oct. 14, 2008 with Reply to Office Action filed on Jan. 13, 2009, in U.S. Appl. No. 12/069,604.

U.S. Patent and Trademark Office, Final Office Action Mailed Apr. 21, 2009 with Reply to Final Office Action filed on Jun. 9, 2009, in U.S. Appl. No. 12/069,604.

*Silicon Laboratories Inc.* (Plaintiff), vs. *Quintic Corporation and Quintic Microelectronics Co., Ltd.* (Defendants), Civil Action No. A10CA066 SS, Complaint for Patent Infringement filed on Jan. 25, 2010, in the United State District Court Western District of Texas Austin Division.

U.S. Appl. No. 12/692,730, filed Jan. 25, 2010, entitled "An Input Stage for an Amplifier," by Dan B. Kasha, et al.

U.S. Patent and Trademark Office, Final Office Action mailed Mar. 3, 2011 in U.S. Appl. No. 12/692,730.

U.S. Patent and Trademark Office, Office Action mailed Oct. 7, 2011 with Reply filed Jan. 5, 2012 in U.S. Appl. No. 12/692,730.

United States District Court for the Western District of Texas, Austin Division, *Silicon Laboratories Inc.*, Plaintiff vs. *Quintic Corporation and Quintic Microelectronics Co., Ltd.*, Defendants, Order of Dismissal signed Aug. 26, 2010.

U.S. Patent and Trademark Office, Office Action mailed Oct. 21, 2010 in U.S. Appl. No. 12/692,730.

Reply to Office Action mailed Oct. 21, 2010 filed on Jan. 20, 2011 in U.S. Appl. No. 12/692,730.

U.S. Appl. No. 13/905,954, filed May 30, 2013, entitled "Radio Receiver Having Enhanced Automatic Gain Control Circuitry ," by Mark May, et al.

\* cited by examiner

REDUCING SECOND ORDER DISTORTION IN AN AMPLIFIER

BACKGROUND

While radio receivers historically were implemented using discrete devices, more commonly today receivers are being implemented with a few or even a single integrated circuit that incorporates various receiver components. While this consolidation has the benefits of reduced size and cost, certain complexities arise.

For example, due to the presence of different components on the integrated circuit, noise and other interference can result. In addition, some of the circuitry within the receiver is implemented with a differential circuitry. Nonlinearities can exist in such circuitry, which can cause degradation of the receiver.

SUMMARY OF THE INVENTION

According to one aspect, an apparatus includes a component of a receiver path to receive and process an incoming signal. At least one element of the component is controllable based on a DC output of the component, to compensate for a second order intermodulation product of the apparatus. As one example, the component is a differential amplifier including a first transistor and a second transistor. The differential amplifier may be coupled to receive an input radio frequency (RF) signal and to output an amplified RF signal.

In turn, a controller may be configured to control a size of at least one of the first and second transistors based on the DC output of the amplifier. As one particular example, the differential amplifier includes: a first transistor having a first terminal to receive the input RF signal, where the input RF signal is a single-ended input RF signal; and a second transistor having a first terminal to couple to a reference voltage node. In one example, the controller is to: selectively disconnect the input RF signal from the first transistor; determine a difference between a first voltage at a first output node coupled to a third terminal of the first transistor and a second voltage at a second output node coupled to a third terminal of the second transistor; and adjust the size of the at least one of the first and second transistors based on the difference. Note that the controller may iteratively adjust the size until the difference reaches a target value.

In an example, the differential amplifier further includes a current source coupled to first and second transistors of the differential amplifier. Note that the control of the controllable element may further compensate for at least a portion of the second order intermodulation product caused by the current source.

In another example, a first degeneration resistor may be coupled between the first transistor and the current source and a second degeneration resistor may be coupled between the second transistor and the current source. At least one of these degeneration resistors may be a controllable element.

In yet another aspect, a differential amplifier is to receive a first signal and to output an amplified differential signal at a differential output node, where the differential amplifier has at least one controllable element that is controlled to maintain a selected DC offset at the differential output node. A controller may be configured to measure a DC offset at the differential output node and to control the at least one controllable element based at least in part on a comparison between the measured DC offset and the selected DC offset. In an example, the controller is to control a size of a first transistor of the differential amplifier when the measured DC offset is greater than the selected DC offset and to control a size of a second transistor of the differential amplifier when the measured DC offset is less than the selected DC offset.

In an example, the differential amplifier includes: a first transistor having a first terminal to receive the first signal, where the first signal is a single-ended input RF signal; and a second transistor having a first terminal coupled to a reference voltage node. The controllable element may correspond to a size of at least one of the first and second transistors, and maintenance of the selected DC offset is to compensate for a second order intermodulation product. Independently or concurrently, the controller may control a size of a degeneration resistor coupled between a transistor and a current source of the differential amplifier based at least in part on the comparison.

In another aspect, a method includes: measuring a difference between a first voltage at a first output node of a differential amplifier of a receiver and a second voltage at a second output node of the differential amplifier; and adjusting a controllable element of the differential amplifier based on the difference until the difference reaches a target value.

The method may further include measuring the difference and adjusting the controllable element during an initiation sequence of the receiver performed by a controller of the receiver. Also, the method may further include selectively disconnecting an input RF signal obtained from an antenna coupled to the receiver from the differential amplifier prior to measuring the difference. Then the input RF signal may be switched to the receiver.

DETAILED DESCRIPTION

In various embodiments, compensation circuitry may be provided within a receiver to limit or cancel interference such as intermodulation products that may arise within the circuit during operation. Such compensation circuitry may be dynamically controlled to adjust for presence of nonlinearities inherent within the receiver. Although the embodiments described herein provide compensation by way of dynamic control of the configuration of a differential amplifier, understand that the described techniques may be applied to other circuits within a receiver in different implementations.

Figure 1:
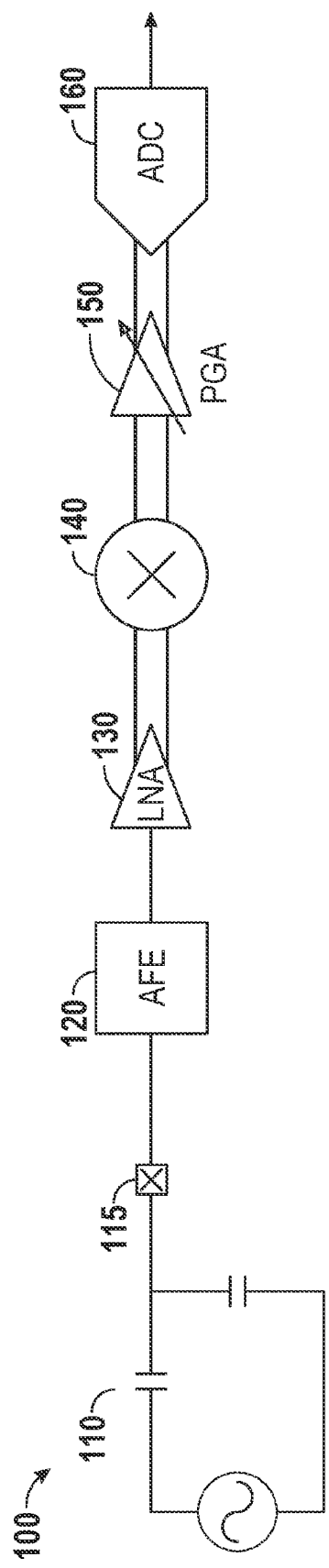
FIG. 1 is a block diagram of a receiver in accordance with an embodiment.

Referring now to FIG. 1, shown is a block diagram of a receiver in accordance with an embodiment. As shown in FIG. 1, receiver 100 is configured to receive a single-ended RF signal from an antenna 110. In the case of AM radio with a whip antenna, antenna 110 is modeled as a voltage source and capacitors coupled to an input node 115 of an integrated circuit (IC) on which the receiver is configured.

The incoming RF signal is provided to a front end attenuator 120, which in an embodiment can be implemented via a resistor network and/or capacitor divider. The corresponding attenuated RF signal is provided to a low noise amplifier (LNA) 130. In general LNA 130 may be configured as a differential amplifier to receive this single-ended RF input signal and output an amplified differential RF signal. Of course understand that the conversion from a single-ended signal to a differential signal may occur at different locations in other embodiments. For example, in some implementations an off-chip balun may be used to perform the conversion. Or other on-chip components such as a mixer or other circuit may equally perform the conversion. And of course in other embodiments, a receiver is configured to receive a differential input RF signal.

As will be described further herein, due to inherent nonlinearities in LNA 130, a measure of intermodulation may be present at the LNA output (and such intermodulation products may also exist in other receiver components). Accordingly, embodiments may provide compensation for such intermodulation products, which in an embodiment may substantially reduce or cancel second order intermodulation products Still referring to FIG. 1, the amplified RF signal output from LNA 130 is coupled to a mixer 140 which is configured to downconvert the RF signal to a lower frequency signal. In various embodiments, receiver 100 may be configured as a low-intermediate frequency (IF) receiver such that mixer 140 operates to downconvert the RF signal to a low-IF signal. Of course other receiver types are possible, and mixer 140 may be configured in such implementations to downconvert the RF signal to another frequency, such as an IF signal, a zero-IF signal, a baseband signal, or another frequency. The resulting downconverted signal from mixer 140 is coupled to an amplifier 150, which in the embodiment shown is a programmable gain amplifier (PGA). PGA 150 may be configured to provide a programmable amount of gain to the downconverted signal and to provide this gain controlled signal to a digitizer 160, such as a multi-bit analog-to-digital converter (ADC) 160. Understand that the digitized signal may be further processed in receiver 100, e.g., in a digital data path implemented in a digital signal processor (DSP) (not shown for ease of illustration). In other embodiments discrete digital logic may be present to perform various digital processing such as filtering, further downconversion, demodulation, decoding and so forth. Although shown at this high level in the embodiment of FIG. 1, understand that many variations are possible.

Figure 2:
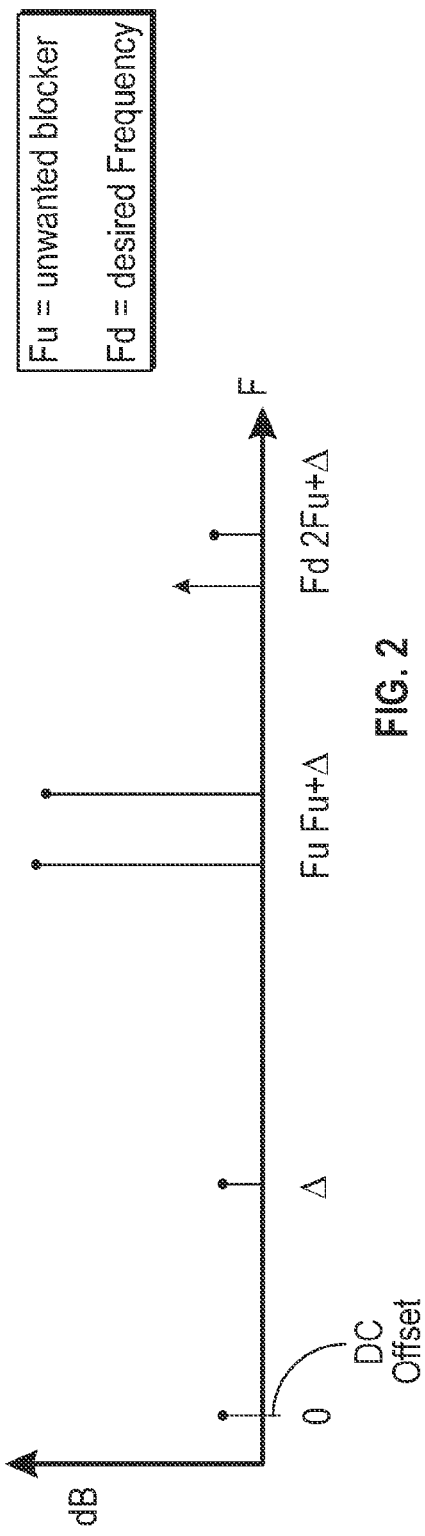
FIG. 2 is a frequency diagram illustrating how second order distortion can impact receiver performance.

Referring now to FIG. 2, shown is a frequency diagram, illustrating a second order distortion that may occur in a nonlinear circuit. As seen in FIG. 2, note the presence of a desired channel at a desired frequency $f_d$, which is at a substantially smaller power level than undesired channels present at frequencies $f_u$ and $f_u$+delta. Specifically shown, a harmonic of the undesired channels (with its distortion product at frequency $2*f_u+\Delta$) can fall within the desired channel or close enough to it to cause degradation of receiver performance. Note that second order nonlinearity creates a term at DC. Accordingly, using an embodiment as described herein, intermodulation products within a receiver can measured and be substantially reduced or cancelled.

Figure 3:
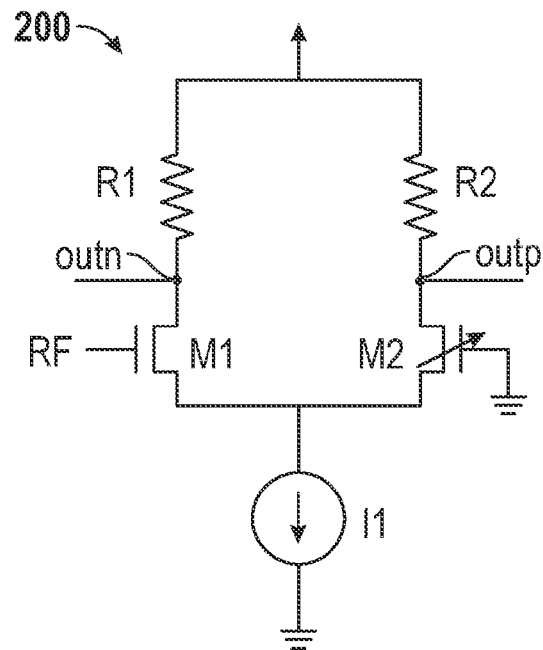
FIG. 3 is a schematic diagram of a differential amplifier in accordance with an embodiment.

Referring now to FIG. 3, shown is a schematic diagram of a differential amplifier in accordance with an embodiment. As shown in FIG. 3, amplifier 200 is a differential amplifier coupled to receive and amplify an incoming RF signal. More specifically, FIG. 3 shows an implementation in which the incoming RF signal (RF) is a single-ended signal that couples to a gate terminal of a first metal oxide semiconductor field effect transistor (MOSFET) M1. Amplifier 200 operates to amplify this incoming RF signal and to output a differential amplified RF signal at output nodes OutN and OutP. Because the input signal is single ended, note that the gate terminal of MOSFET M2 is coupled to a reference voltage node (e.g., a ground node). To provide a measure of compensation for reducing or cancelling second order distortion, MOSFET M2 may be controllable to have an adjustable size. Details of the control of MOSFET M2 are discussed further below. Instead in a situation in which the incoming RF signal is a differential signal, of course the other portion of the differential signal would instead be coupled to the gate terminal of MOSFET M2.

Still referring to FIG. 3, MOSFETs M1 and M2 have commonly coupled source terminals coupled to a current source I1 that in turn is coupled to the reference voltage node. And in turn, the drain terminals of MOSFETs M1 and M2 couple to output nodes OutN and OutP. As further shown, a pair of resistors R1 and R2 may further couple to the output nodes (and drain terminals of the MOSFETs) to present a desired load.

In the embodiment of FIG. 3, the controllable element is MOSFET M2. In an embodiment, MOSFET M2 is a set of parallel coupled MOSFETs that can be switchably coupled by corresponding switches either into or out of the differential amplifier, e.g., under control of a controller such as a microcontroller unit (MCU), which may be configured on the same semiconductor die as the differential amplifier (and the remainder of a receiver). In this way, second order intermodulation products can be controlled by controlling a size of at least one MOSFET. However, understand that in addition to enabling controllability of MOSFET M2 via adjustment of its size, the size of MOSFET M1 also may be controlled. That is, in another embodiment, both MOSFETs M1 and M2 may be implemented as parallel sets of individual MOSFETs that are controllably coupled into the signal processing path.

For example, when a second order nonlinearity is present in the LNA, it results in a DC offset at the LNA output (recall the DC term shown in FIG. 2). When this DC offset varies from a target offset value in a first direction, the size of MOSFET M1 may be controlled (for example). Similarly, when a DC offset present at the output nodes varies from the target offset value in a second direction, the size of MOSFET M2 instead may be controlled (for example). Furthermore, understand that although the controllable element shown in FIG. 3 is a MOSFET, in other implementations other controllable elements may be provided, either complementary to or instead of this MOSFET control.

Figure 4:
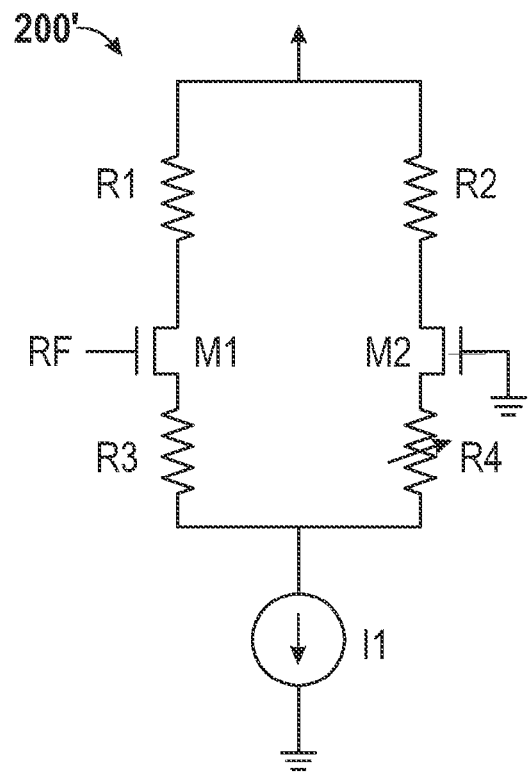
FIG. 4 is a block diagram of a differential amplifier having a different type of controllable element in accordance with another embodiment.

Referring now to FIG. 4, shown is a block diagram of a differential amplifier having a different type of controllable element. As shown in the embodiment of FIG. 4, differential amplifier 200' may be configured similarly to that of differential amplifier 200 of FIG. 3. However, note that in the embodiment of FIG. 4, MOSFETs M1 and M2 may be of a non-controllable variety. That is, MOSFETs M1 and M2 have a fixed size. In the embodiment of FIG. 4, coupled between the source terminals of MOSFETs M1 and M2 and current source I1 are corresponding degeneration resistors R3 and R4.

As shown, degeneration resistor R4 may be a controllable element such that its resistance is controllably varied, e.g., based on a DC offset present at the output nodes. In an embodiment, degeneration resistor R4 may be configured as a set of resistors switchably connected in parallel between the source terminal of MOSFET M2 and current source I1 by corresponding switches, e.g., under control of the MCU or other controller. However, understand that in addition to enabling controllability of R4 via adjustment of its size, the size of degeneration resistor R3 also may be controlled. That is, in another embodiment, both degeneration resistors R3 and R4 may be implemented as parallel sets of individual resistors that are controllably coupled into the signal processing path.

Figure 5:
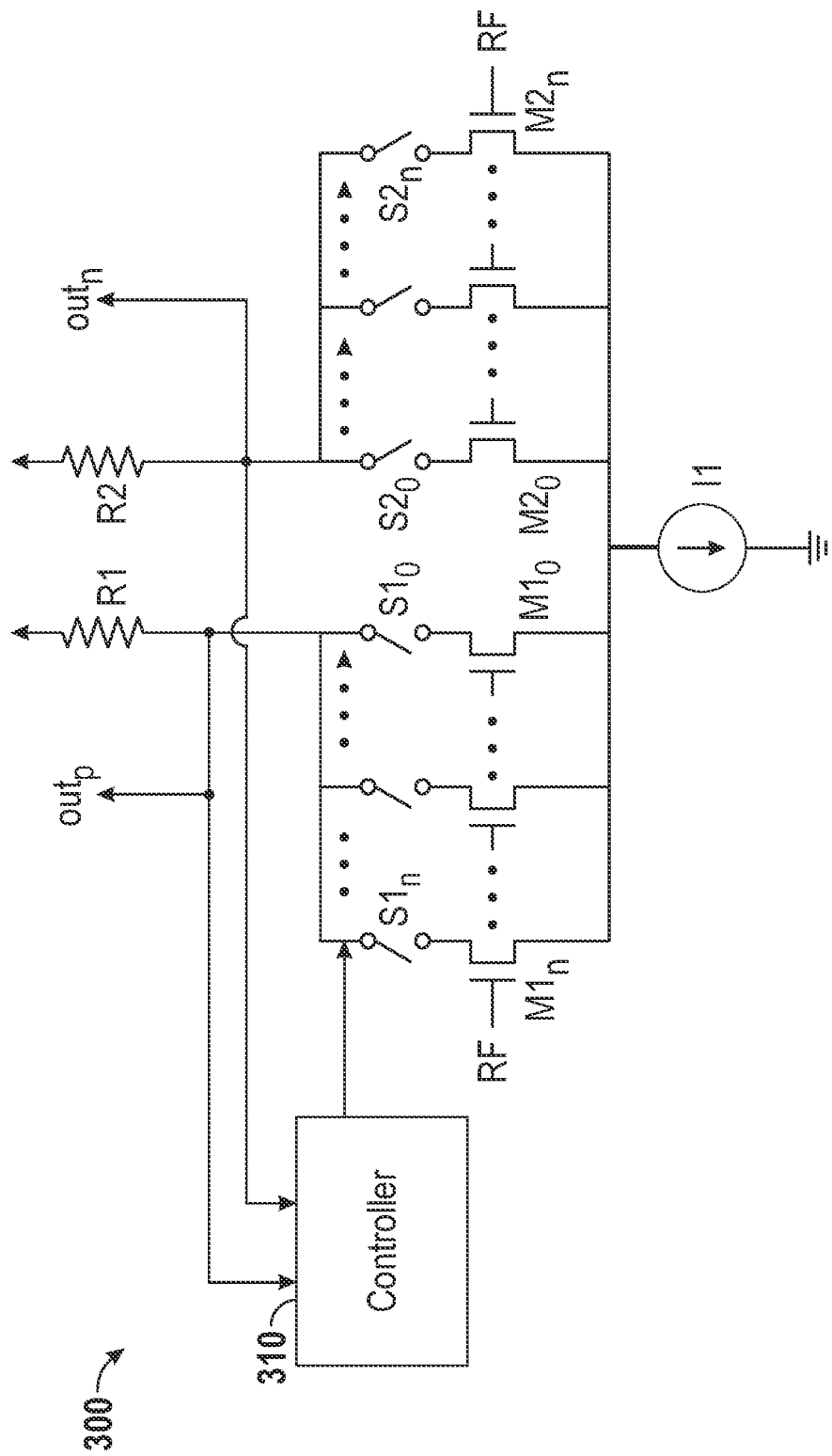
FIG. 5 is a schematic diagram of a further illustration of providing control of a MOSFET to perform intermodulation compensation.

Thus different manners of controlling a controllable element of a differential amplifier may occur in different embodiments to provide intermodulation compensation. Referring now to FIG. 5, shown is a schematic diagram of a further illustration of providing control of a MOSFET to perform intermodulation compensation. As shown in FIG. 5, a differential amplifier 300 includes a parallel set of MOSFETs $M1_0$-$M1_n$ and $M2_0$-$M2_n$, each of which is coupled to a corresponding switch $S1_0$-$S1_n$ and $S2_0$-$S2_n$ such that when the given switch is closed, the corresponding MOSFET is switched into the differential amplifier. In an embodiment, the individual transistors each may be weighted of a different value (e.g., a binary weighting, a radix weighting or another type of weighting). Understand that in an alternate embodiment, each of the transistors may be of the same size.

In the illustration of FIG. 5, when enabled by a corresponding switch, the given MOSFET is coupled between current source I1 and output node OutP or OutN. In this way, the size of one or more of the MOSFETs presented in differential amplifier 300 may be adjustably controlled. More specifically, a controller 310 is configured to receive a differential output voltage of the differential amplifier. Controller 310 may include hardware, software, firmware and/or combinations thereof to perform compensation control as described herein. To this end, controller 310 may be configured to execute instructions for performing compensation control, where the instructions are stored in a non-transitory storage and accessible to controller 310. Based on the difference of the DC outputs of the two branches of the differential amplifier (namely, at node OutP and differential output node OutN) controller 310 may send control signals to cause selected one or more of switches $S1_0$-$S1_n$ and $S2_0$-$S2_n$ to enable the corresponding ones of MOSFETs $M1_0$-$M1_n$ and $M2_0$-$M2_n$ to be switched into the circuit.

Thus in the embodiment shown, similar components are present in the second branch of the differential amplifier such that the size of another parallel set of MOSFETs may similarly be controlled. In a particular embodiment based on whether the difference between the DC output voltage at output nodes OutP and OutN is positive or negative, only one of the sets of MOSFETs may have its size controllably adjusted while the other side of MOSFETs may be fully switched on or off.

Figure 6:
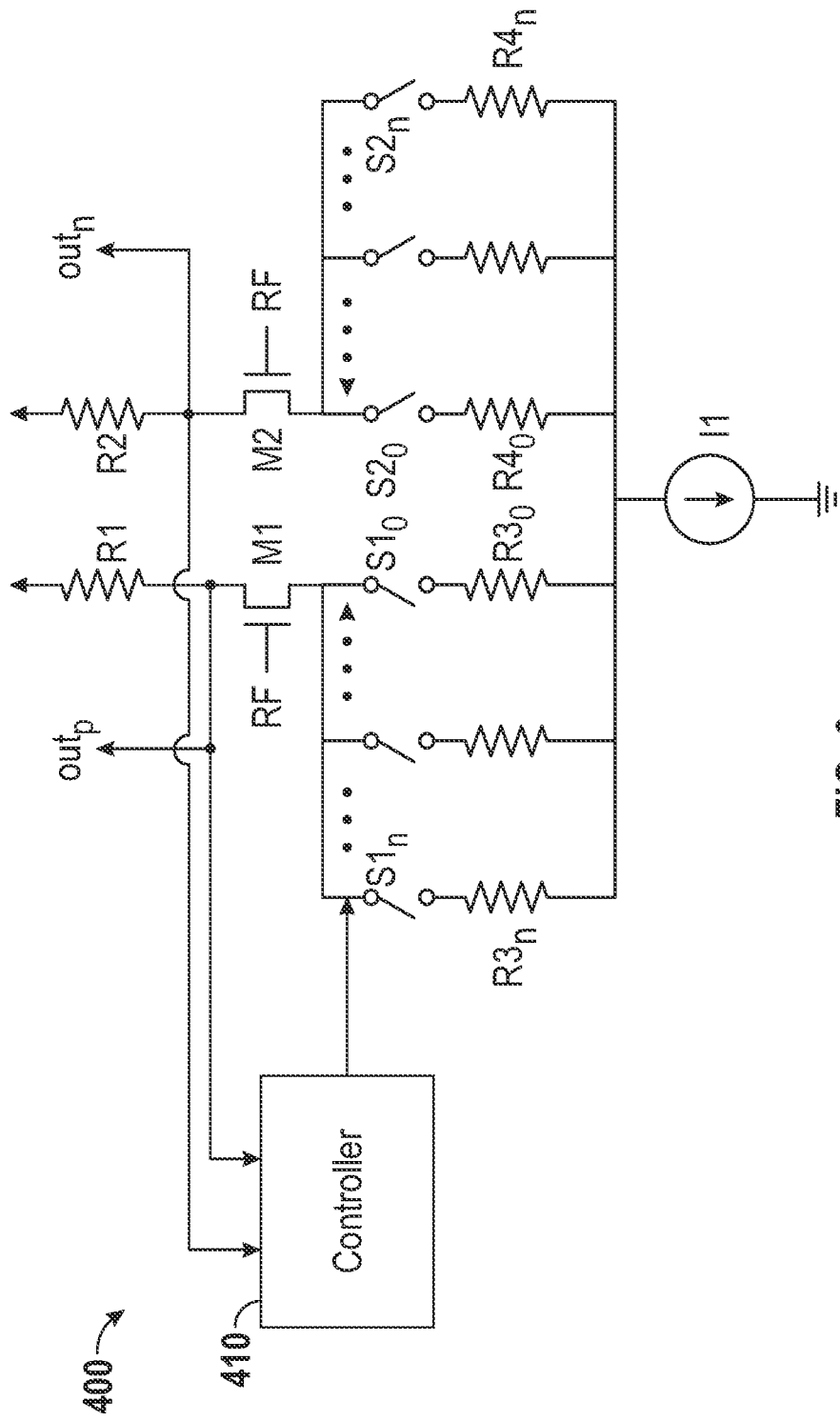
FIG. 6 is a schematic diagram of a further illustration of providing control of a degeneration resistor to perform intermodulation compensation.

Referring now to FIG. 6, shown is a schematic diagram of a further illustration of providing control of a MOSFET to perform intermodulation compensation. As shown in FIG. 6, a differential amplifier 400 includes a MOSFET M1 that has a source terminal coupled to a degeneration resistor R3 that is formed of a parallel set of resistors $R3_0$-$R3_n$, each of which is coupled to a corresponding switch $S1_0$-$S1_n$ such that when the given switch is closed, the corresponding resistor is coupled to the differential amplifier. In an embodiment, the individual resistors each may be weighted of a different value (e.g., a binary weighting, a radix weighting or another type of weighting). Understand that in an alternate embodiment, each of the resistors may be of the same size. As further shown in FIG. 6, differential amplifier 400 also includes a MOSFET M2 that has a source terminal coupled to a degeneration resistor R4 that is formed of a parallel set of resistors $R4_0$-$R4_n$, each of which is coupled to a corresponding switch $S2_0$-$S2_n$ such that when the given switch is closed, the corresponding resistor is coupled to the differential amplifier.

In the illustration of FIG. 6, when enabled by a corresponding switch, the given resistor is coupled between current source I1 and MOSFET M1 or M2. In this way, the size of the degeneration resistors may be adjustably controlled. More specifically, a controller 410 is configured to receive a differential output voltage of the differential amplifier. Controller 410 may include hardware, software, firmware and/or combinations thereof to perform compensation control as described above. Based on the difference of the DC outputs of the two branches of the differential amplifier (namely, at node OutP and differential output node OutN) controller 410 may send control signals to cause selected one or more of switches $S1_0$-$S1_n$ and $S2_0$-$S2_n$ to enable the corresponding ones of resistors $R3_0$-$R3_n$ and $R4_0$-$R4_n$ to be switched into the circuit.

Understand that while shown with only a single branch for ease of illustration, similar components may be present in the second branch of the differential amplifier such that the size of another parallel set of resistors may similarly be controlled. In a particular embodiment based on whether the difference between the DC output voltage at output nodes OutP and OutN is positive or negative, only one of the sets of resistors may have its size controllably adjusted while the other side of resistors may be fully switched on.

Figure 7:
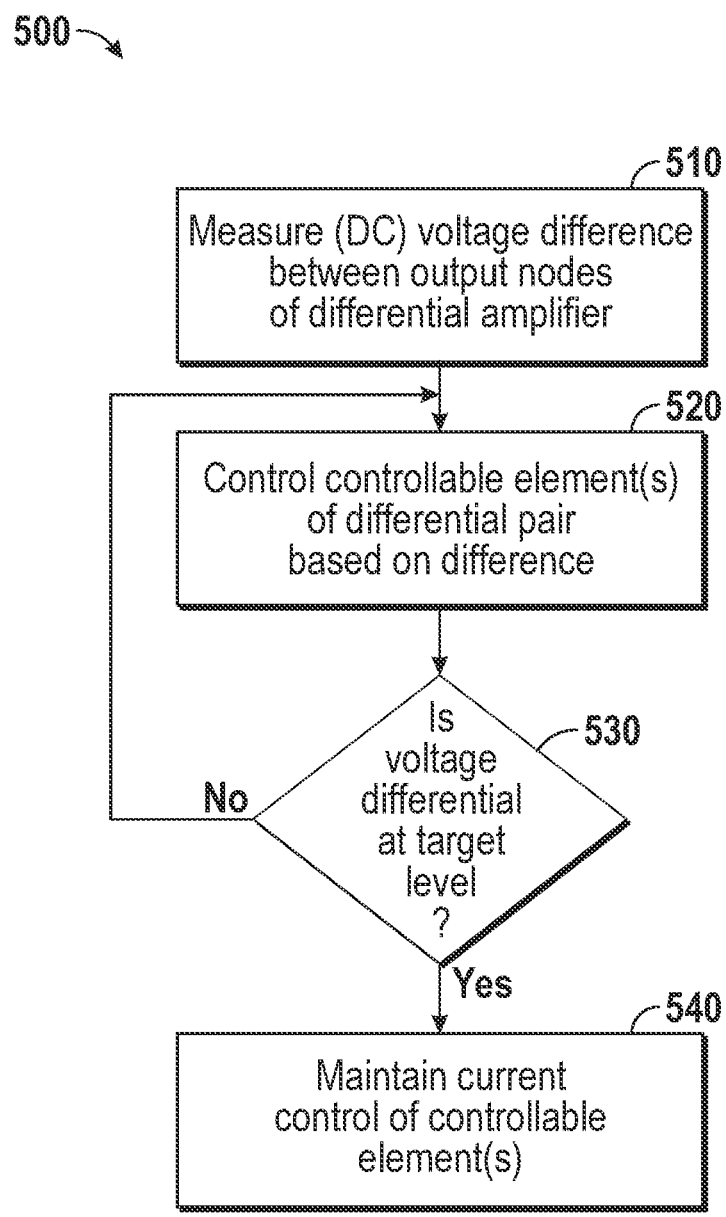
FIG. 7 is a flow diagram of a control method in accordance with an embodiment.

Referring now to FIG. 7, shown is a flow diagram of a method in accordance with an embodiment. As shown in FIG. 7, method 500 may be used to control a differential amplifier using a technique as described herein. In various implementations, method 500 may be performed by a controller of a receiver, e.g., on startup or reset of the receiver, or upon another event for which it is desirable to update the control settings for the differential amplifier. Note that prior to beginning the compensation method, the differential amplifier is switched out of a signal path of the receiver, so that correct compensation can be determined.

As seen in FIG. 7, method 500 begins by measuring a voltage difference (block 510). More specifically, a DC voltage difference may be measured between output nodes of the differential amplifier. Note that prior to this operation, the differential amplifier may be switched to be disconnected from an incoming signal such that the voltage difference measured is at DC, when no input signal is provided to the differential amplifier.

Still referring to FIG. 7, next control passes to block 520 where one or more controllable elements may be controlled based on this difference. In the embodiments described herein, the controllable elements may be a size of one or more of the MOSFETs that form the differential amplifier, a size of one or more degeneration resistors, or another controllable element of an amplifier or another component coupled to the amplifier. As one such example, when the voltage difference is a positive value, the size of a first set of MOSFET's, e.g., coupled to a positive input node of the differential amplifier may be adjusted. Instead, when the voltage difference is a negative value, the size of a second set of MOSFET's, e.g., coupled to a negative input node of the differential amplifier may be adjusted.

Control next passes to diamond 530 where it is determined whether the voltage differential is at a target level. Note that different target levels may be set in different implementations. For example, in one embodiment this target level may correspond to a zero offset level, e.g., 0 V. However, in other embodiments, due to additional nonlinearities present in the receiver the target level may be at a predetermined voltage level, e.g., between approximately 10 mV and 20 mV. If it is determined that the measured differential is not at the target level, control passes back to block 520 where further control of the controllable element(s) may occur. Otherwise control passes to block 540. At block 540 the current control of the controllable elements may be maintained.

Note that after conclusion of method 500 to perform the compensation described herein, the differential amplifier may be switched back into the circuit such that it may receive an incoming RF signal during normal receiver operation.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a differential amplifier including a first transistor and a second transistor, the differential amplifier coupled to receive an input radio frequency (RF) signal and to output an amplified RF signal, wherein at least one element of the differential amplifier is controllable based on a DC output of the differential amplifier, to compensate for a second order intermodulation product of the apparatus.

2. The apparatus of claim 1, wherein the differential amplifier comprises a front end component of a radio receiver.

3. The apparatus of claim 1, further comprising a controller to control a size of at least one of the first and second transistors based on the DC output of the differential amplifier.

4. The apparatus of claim 3, wherein the differential amplifier comprises:
   the first transistor having a first terminal to receive the input RF signal, wherein the input RF signal is a single-ended input RF signal; and
   the second transistor having a first terminal to couple to a reference voltage node.

5. The apparatus of claim 3, wherein the controller is to:
   selectively disconnect the input RF signal from the first transistor;
   determine a difference between a first voltage at a first output node coupled to a third terminal of the first transistor and a second voltage at a second output node coupled to a third terminal of the second transistor; and
   adjust the size of the at least one of the first and second transistors based on the difference.

6. The apparatus of claim 5, wherein the controller is to iteratively adjust the size until the difference reaches a target value.

7. The apparatus of claim 1, wherein the differential amplifier further comprises a current source coupled to first and second transistors of the differential amplifier.

8. The apparatus of claim 7, wherein the control of the controllable element is further to compensate for at least a portion of the second order intermodulation product caused by the current source.

9. The apparatus of claim 7, further comprising:
   a first degeneration resistor coupled between the first transistor and the current source; and
   a second degeneration resistor coupled between the second transistor and the current source, wherein at least one of the first and second degeneration resistors comprises the at least one element controllable based on the DC output.

10. An apparatus comprising:
    a differential amplifier to receive a first signal and to output an amplified differential signal at a differential output node, the differential amplifier having at least one controllable element, wherein the at least one controllable element is controlled to maintain a selected DC offset at the differential output node;
    a controller to measure a DC offset at the differential output node and to control the at least one controllable element based at least in part on a comparison between the measured DC offset and the selected DC offset, wherein the controller is to control at least one of:
    a size of a first transistor of the differential amplifier when the measured DC offset is greater than the selected DC offset and to control a size of a second transistor of the differential amplifier when the measured DC offset is less than the selected DC offset; and
    a size of a degeneration resistor coupled between the first transistor and a current source of the differential amplifier based at least in part on the comparison.

11. The apparatus of claim 10, wherein the differential amplifier comprises:
    the first transistor having a first terminal to receive the first signal, wherein the first signal is a single-ended input radio frequency (RF) signal; and
    the second transistor having a first terminal coupled to a reference voltage node.

12. The apparatus of claim 11, wherein the at least one controllable element corresponds to the size of at least one of the first transistor and the second transistor of the differential amplifier, wherein maintenance of the selected DC offset is to compensate for a second order intermodulation product.

13. A method comprising:
    measuring, during an initiation sequence of a receiver performed by a controller of the receiver, a difference between a first voltage at a first output node of a differential amplifier of the receiver and a second voltage at a second output node of the differential amplifier; and
    adjusting, during the initiation sequence, a controllable element of the differential amplifier based on the difference until the difference reaches a target value.

14. The method of claim 13, further comprising selectively disconnecting an input radio frequency (RF) signal obtained from an antenna coupled to the receiver from the differential amplifier prior to measuring the difference.

15. The method of claim 14, further comprising thereafter switching the input RF signal to the differential amplifier.

16. The method of claim 13, wherein adjusting the controllable element comprises adjusting a size of at least one of a first transistor and a second transistor of the differential amplifier.

* * * * *